US010156025B2

(12) United States Patent
Kolis et al.

(10) Patent No.: US 10,156,025 B2
(45) Date of Patent: Dec. 18, 2018

(54) MONOLITHIC HETEROGENEOUS SINGLE CRYSTALS WITH MULTIPLE REGIMES FOR SOLID STATE LASER APPLICATIONS

(71) Applicant: CLEMSON UNIVERSITY, Clemson, SC (US)

(72) Inventors: Joseph W. Kolis, Central, SC (US); Colin D. McMillen, Liberty, SC (US)

(73) Assignee: University of South Carolina, Columbia, SC (US)

( * ) Notice: Subject to any disclaimer, the term of this patent is extended or adjusted under 35 U.S.C. 154(b) by 260 days.

(21) Appl. No.: 15/146,080

(22) Filed: May 4, 2016

(65) Prior Publication Data

US 2016/0326667 A1 Nov. 10, 2016

Related U.S. Application Data

(60) Provisional application No. 62/156,550, filed on May 4, 2015.

(51) Int. Cl.
| | | |
|---|---|---|
| *C30B 9/02* | (2006.01) | |
| *C30B 29/28* | (2006.01) | |
| *C30B 7/10* | (2006.01) | |
| *H01S 3/06* | (2006.01) | |
| *H01S 3/16* | (2006.01) | |
| *H01S 3/063* | (2006.01) | |
| *H01S 3/113* | (2006.01) | |

(52) U.S. Cl.
CPC ............... *C30B 29/28* (2013.01); *C30B 7/10* (2013.01); *H01S 3/0612* (2013.01); *H01S 3/0617* (2013.01); *H01S 3/0632* (2013.01); *H01S 3/113* (2013.01); *H01S 3/1611* (2013.01); *H01S 3/1618* (2013.01); *H01S 3/1643* (2013.01); *H01S 2301/02* (2013.01)

(58) Field of Classification Search
CPC .... C30B 9/00; C30B 9/02; C30B 9/04; C30B 29/22
See application file for complete search history.

(56) References Cited

U.S. PATENT DOCUMENTS 3,505,239 A 4/1970 Mazelsky et al.
4,305,778 A 12/1981 Gier et al.
(Continued)

FOREIGN PATENT DOCUMENTS

EP 0065382 A1 11/1982

OTHER PUBLICATIONS

Armstrong et al., "Novel composite structure Nd: YAG gain media for high power scaling of side-pumped configurations", *Optics Communications*, (2000), 175, pp. 201-207.
(Continued)

*Primary Examiner* — Robert M Kunemund
(74) *Attorney, Agent, or Firm* — Dority & Manning, P.A.

(57) ABSTRACT

Heterogeneous monolithic crystals that can include multiple regimes in a complex geometry are described. The crystals can be advantageously utilized in laser applications. The heterogeneous crystals can be created through growth of different regimes in interior voids formed in a seed crystal, which can in turn be homogeneous or heterogeneous. In one particular embodiment, a regime can be grown within a void of a seed crystal by use of a hydrothermal growth process. Formed crystals can be utilized in lasing and waveguiding applications, among others.

8 Claims, 6 Drawing Sheets

(56) References Cited

U.S. PATENT DOCUMENTS

| | | |
|---|---|---|
| 5,066,356 A | 11/1991 | Ferretti et al. |
| 5,119,382 A | 6/1992 | Kennedy et al. |
| 5,140,658 A | 8/1992 | Sunshine |
| 5,290,730 A | 3/1994 | McFarlane |
| 5,309,471 A | 5/1994 | Chambaz |
| 5,394,413 A | 2/1995 | Zayhowski |
| 5,441,803 A | 8/1995 | Meissner |
| 5,495,494 A | 2/1996 | Molva et al. |
| 5,502,737 A | 3/1996 | Chartier et al. |
| 5,563,899 A | 10/1996 | Meissner et al. |
| 5,761,233 A | 6/1998 | Bruesselbach et al. |
| 5,846,638 A | 12/1998 | Meissner |
| 5,900,057 A | 5/1999 | Buchal |
| 6,025,060 A | 2/2000 | Meissner |
| 6,437,109 B1 | 8/2002 | Reznikoff et al. |
| 6,834,070 B2 | 12/2004 | Zapata |
| 6,845,111 B2 | 1/2005 | Sumida et al. |
| 6,944,196 B2 | 9/2005 | Wittrock |
| 6,973,115 B1 | 12/2005 | Ferrand et al. |
| 7,203,209 B2 | 4/2007 | Young et al. |
| 7,211,234 B2 | 5/2007 | Kolis et al. |
| 7,374,616 B2 | 5/2008 | Kolis |
| 7,540,917 B2 | 6/2009 | Kolis et al. |
| 7,563,320 B2 | 7/2009 | Kolis et al. |
| 7,597,896 B2 | 9/2009 | Kolis et al. |
| 7,731,795 B2 | 6/2010 | Kolis et al. |
| 8,854,725 B2 * | 10/2014 | Hamada .................. F21K 9/64 359/326 |
| 9,014,228 B1 | 4/2015 | Kolis et al. |
| 2003/0160034 A1 | 8/2003 | Filgas |
| 2005/0200235 A1 | 9/2005 | Higuchi et al. |
| 2005/0226303 A1 | 10/2005 | Suzudo et al. |
| 2006/0233209 A1 | 10/2006 | Kirilov |
| 2007/0071059 A1 | 3/2007 | Afzal et al. |
| 2007/0098024 A1 | 5/2007 | Mitchell |
| 2007/0196571 A1 * | 8/2007 | Ozin .................. B32B 3/30 427/199 |
| 2007/0237483 A1 | 10/2007 | Nahimoto |
| 2007/0253453 A1 | 11/2007 | Essaian et al. |
| 2009/0041067 A1 | 2/2009 | Meissner et al. |
| 2009/0151621 A1 | 7/2009 | Kolis et al. |
| 2010/0110536 A1 | 5/2010 | Nashimoto |
| 2010/0189619 A1 | 7/2010 | Kolis et al. |
| 2011/0100548 A1 | 5/2011 | Shaw |
| 2012/0045661 A1 | 2/2012 | Kumaran |
| 2013/0343715 A1 | 12/2013 | Kolis et al. |
| 2013/0344277 A1 | 12/2013 | Kolis |
| 2015/0236470 A1 | 8/2015 | Newburgh |

OTHER PUBLICATIONS

Azrakanstyan et al., "Yb3+: YAG crystal growth with controlled doping distribution," *Optical Materials Express* (2012), 2 (1).

Degnan, "Optimization of Passively Q-Switched Lasers" *IEEE Journal of Quantum Electroic*, 31, 11, (1995) pp. 1890-1901.

Forbes et al., "The hydrothermal syntheseis, solubility and crystal growth of $YVO_4$ and $Nd:YVO_4$ ", *Journal Crystal Growth*, 310 (2008), pp. 4472-4476.

Feldman et al., "Dynamics of chromium ion valence transformations in Cr, Ca:YAG crystals used as laser gain and passive Q-switching media", *Optical Materials*, (2003), 24, pp. 333-344.

B. Ferrand, et al., "Liquie phase eiptaxy: A versatile technique for the development of miniature optical components in single crystal dielectric media", *Optical Materials*. 11, (1999), pp. 101-114.

Kolb, et al., "Phase Equilibria of $Y_3 Al_5 O_{12}$, Hydrothermal Growth of $Gd_3 Ga_5 O_{12}$ and Hydrothermal Epitaxy of Magnetic Garnets" *Journal of Crystal Growth*, 29, (1975), pp. 29-39.

Okhrimchuk, et al., "Performance of YAG:$Cr^{4+}$laser crystal" *Optical Materials*, 3, (1994) pp. 1-13.

Song et al., Growth of composite sapphire/Ti:sapphire by the hydrothermal method, *J. Crystal Growth*, 277, (2005), pp. 200-204.

Zayhowski, "Microchip Lasers", *Optical Materials*, 11 (1999) pp. 255-267.

Zayhowski, "Q-switched microchip lasters find real-world application" *Laser Focus World*, Aug. (1999), pp. 129-136.

Mao et al., "High Efficient Laser Operation of the High-Doped Nd:YAG Crystal Grown by Temperature Gradient Technology", Chin.Phys.Lett. 19 (9), 2002, 1293-1295.

Huang et al., "Nd: YVO4 single crystal fiber growth by the LHPG method", J of Crystal Growth 229 (2001) 184-187.

Abstract for NSF award #0907395, http://www.nsf.gov/awardsearch/showAward?AWD_ID=0907395&HistoricalAwards=false, retrieved May 21, 2016.

R.A. Laudise, J.W. Nielson, Solid State Phys. 12 (1961) 149-222.

Mill, Sov. Phys. Crystallogr. 12 (1967) 195.

Puttbach, et al., J. Phys. Chem. Solids, Suppl 1 (1967) 569-571.

* cited by examiner

MONOLITHIC HETEROGENEOUS SINGLE CRYSTALS WITH MULTIPLE REGIMES FOR SOLID STATE LASER APPLICATIONS

CROSS REFERENCE TO RELATED APPLICATION

This application claims filing benefit of U.S. Provisional Patent Application Ser. No. 62/156,550 having a filing date of May 4, 2015, which is incorporated herein by reference for all purposes.

STATEMENT AS TO RIGHTS TO INVENTIONS MADE UNDER FEDERALLY SPONSORED RESEARCH

This invention was made with Government support under Grant No. 0907395 awarded by the National Science Foundation. The Government has certain rights in the invention.

BACKGROUND

Typically, a solid-state laser cavity contains a crystal host material that is doped with a small amount of an activator ion. This ion can be pumped by a light source such as a flash lamp or more commonly, a diode laser of suitable frequency. The light from the pump is absorbed by the gain medium, i.e., the doped host material, creating a population inversion that causes stimulated emission of coherent light. The laser cavity generally contains mirrors at each end that reflect most of the emitted light back into the cavity, which stimulates increasingly greater emission. This emitted light is coherent, meaning that the light is a single wavelength, is single phase and unidirectional. The output light can be in the form of continuous or pulsed emission.

While the gain medium can be the only crystal regime of a laser cavity, solid-state lasers often employ several crystal regimes that serve a series of purposes including thermal management, mechanical strength, waveguiding, and the like. These regimes can occur in the form of a series of layers that have similar dimensions, but with different chemical compositions where the different compositions reflect the different functions. The compositions of the different regimes generally include a common host material with one or more different dopants (and/or different dopant concentrations) in different regimes, with the amount and type of dopant(s) selected based upon the function of each regime.

One such regime can minimize amplified spontaneous emission (ASE). In ASE, photons at the lasing wavelength are occasionally and spontaneously emitted from the lasing ions with population inversions. In contrast to stimulated emissions (lasing), in which the emission is coherent and directional, the ASE photons emit in all directions. These emissions can reflect back from the crystal surface and induce further emission from the excited states thus depleting the population inversion and reducing the power and efficiency of the laser cavity. To minimize ASE, a regime can be included in the laser cavity that is doped with an ion that can absorb the spontaneously emitted photons and allow them to relax as thermal emission, thus preventing them from inducing further depletion of the population inversion of the lasing ions. Typically an ASE regime is situated around the edges of the lasing crystal as cladding.

Laser waveguides also use multiple different regimes. Waveguides include two or more regimes with similar lattice structures whereby an internal portion, or core, contains a material having an index of refraction that is larger than that of an outer portion material, or cladding. Thus, total internal reflectance can be achieved and essentially all light that enters will exit downstream. This condition is most commonly exploited in fiber optics but can also work for other applications. In a planar waveguide, a third layer can be applied to form a three layer construct. If conditions are selected to ensure that that index of refraction of the central layer is larger than the outer regimes, total internal reflection can be achieved and a planar waveguide created.

Whatever the application of different regimes, the interface between adjacent regimes is of importance as it can have a large effect on overall beam quality. For instance, if the output beam is to be frequency manipulated through a non-linear process (for example second harmonic generation or optical parametric oscillation), it is important to have interfaces between adjacent regimes with controlled lattice orientations to control polarization interaction with the pump light.

Various methods have been devised to form multi-regime laser cavities. One method includes direct bonding of the different regime materials to one another. Use of glues, fluxes or other bonding materials has been examined but can be unacceptable due to degradation of the optical beam quality. Other direct bonding methods include pressure bonding, electrical potential fusion and diffusion bonding.

A second method for the production of a multi-regime laser cavity is the direct growth of different regimes in layers on an underlying substrate (e.g., a previously formed regime). Direct growth has been accomplished through epitaxial growth in which one regime material acts as a substrate and a second regime material is deposited on the surface in a stepwise controlled manner. The grown layer can in some formation methods adopt the general structural characteristics of the substrate (such as same lattice type and/or similar dimensions).

Liquid phase epitaxy (LPE) has been used to form multiple regimes. LPE employs high temperature fluxes to dissolve the substrate material and deposit the new layers on the substrate seed via supersaturation. It typically employs molten salts that are usually mixtures of lead oxide and boron oxide or other metal oxides that melt between 1200° C. and 1600° C. and impart modest solubility to the desired layer material.

Hydrothermal methods have also been described in formation of single monolithic crystals with different regimes. Hydrothermal techniques, in which a temperature differential is developed across a reactor to create a supersaturated solution leading to crystal growth on a seed, have been utilized for bulk single crystal growth.

Unfortunately, formation methods have been limited to relatively simplistic overall designs, with the most complicated geometries including successive layers grown on or adhered to one another, optionally followed by cutting and polishing the resulting bulk crystals to form the final product. What are needed in the art are heterogeneous crystals having more complicated geometries, which can be used for example to improve design of the geometry of a laser cavity and thus better control the application of each regime for more efficient use.

SUMMARY

According to one embodiment, a monolithic heterogeneous crystal comprising a first crystal regime and a second crystal regime is described. The first regime and the second regime can include the same host material but can differ from one another by the presence or quantity of one or more dopants. The first regime has a top and an opposite bottom. The first regime also has a first side and an opposite second side, both of which extend from the top to the bottom. The second regime is adjacent to at least a portion of the first side, a portion of the second side, and a portion of the bottom of the first regime.

A method of forming a monolithic heterogeneous crystal is also described. For instance, a method can include forming a void in a crystal. The crystal includes a first composition that includes a host material. The void can extend from a surface of the crystal to an interior location within the crystal. Thus, the void can define a depth in the crystal. The method can also include depositing a second composition within the void. The second composition also includes the host material. The first and second compositions differ from one another by the presence and/or quantity of one or more dopants. According to one embodiment, the second composition can be deposited within the void according to a hydrothermal growth method. According to one embodiment, the void can extend from multiple surfaces of the crystal.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Figure 1:
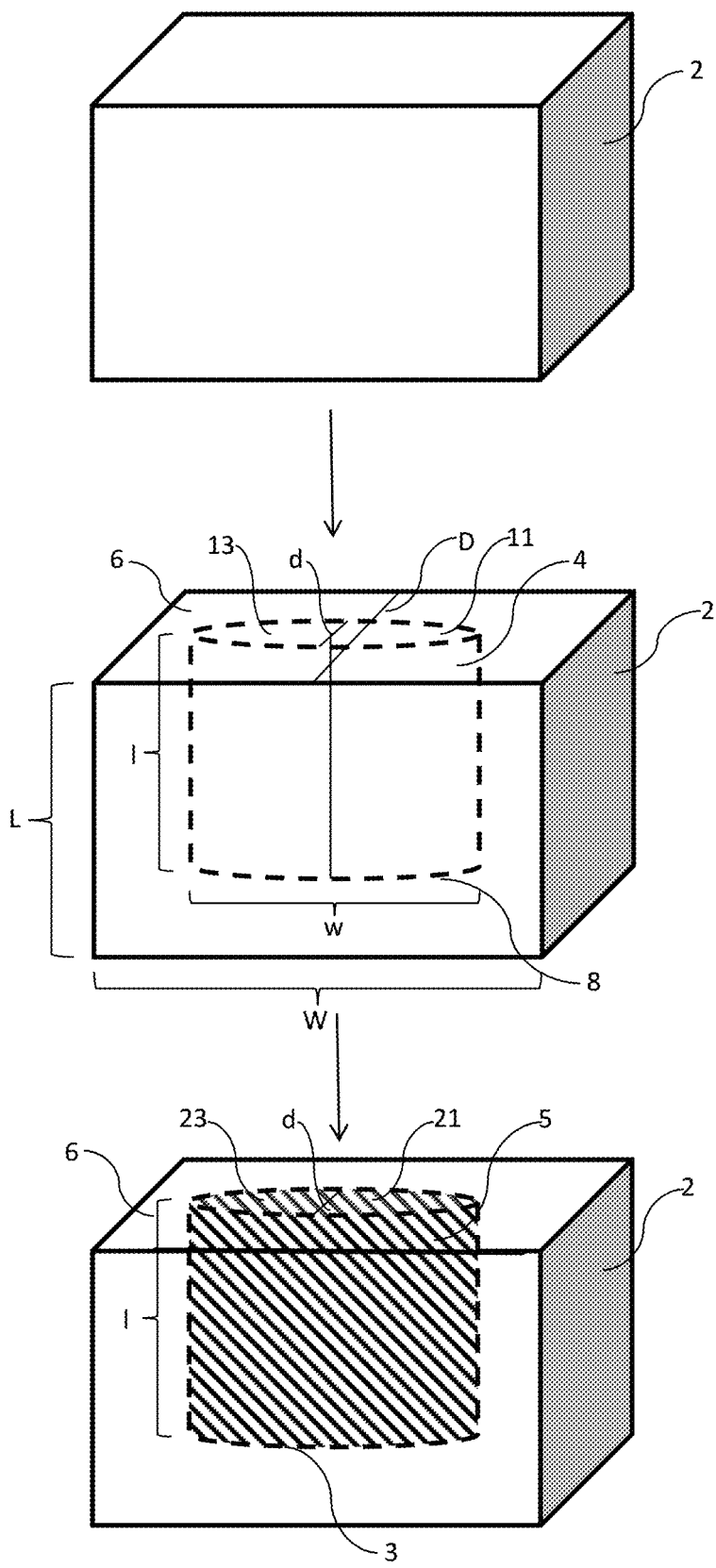
FIG. 1 schematically illustrates a formation process for a heterogeneous monolithic crystal as described herein.

Repeat use of reference characters in the present specification and drawings is intended to represent the same or analogous features or elements of the disclosed subject matter.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

This disclosure is generally directed to heterogeneous monolithic crystals that can include multiple regimes in a complex geometry and can be advantageously utilized in one embodiment as a multi-regime crystal in laser applications. The disclosed crystals can be created through growth of one or more regimes within an interior void formed in a seed crystal, which can in turn be homogeneous or heterogeneous. In one particular embodiment, a regime can be grown within a void of a seed crystal by use of a hydrothermal growth process.

For the purposes of this invention description the term "void" is generally defined as a region within a crystal from which the formation material of the crystal has been removed. A void can generally extend from one or more surfaces of the crystal such that a depth of the void is less than the depth of the crystal along at least one dimension of the void. For example, the void can extend from a top surface of the crystal to a predetermined depth and can also extend from a first side surface of the crystal to an opposite second side surface of the crystal, forming an open trench that runs along the top surface of the crystal. In another embodiment, the void can extend from only one surface of the crystal to a desired depth, forming a hole in the crystal that is surrounded on all other sides by the crystal material.

FIG. 1 demonstrates one process for forming a monolithic heterogeneous crystal. The process can utilize a seed crystal 2 that can include a crystalline material suitable for use in a laser cavity. For example, the seed crystal 2 can be a homogeneous or heterogeneous seed crystal that includes doped and/or undoped host material suitable for use in a laser cavity. In general, in those embodiments in which the seed crystal 2 is a heterogeneous seed crystal including multiple regimes, multiple regimes can include the same host material and can differ from one another by the presence and/or quantity of one or more dopants. For instance, the seed crystal 2 can include but is not limited to a doped or undoped garnet host material such as yttrium aluminum garnet ($Y_3Al_5O_{12}$; YAG), lutetium aluminum garnet ($Lu_3Al_5O_{12}$; LuAG), $Gd_3Sc_2Ga_5O_{12}$ (GSGG), and $Gd_3Ga_5O_{12}$ (GGG). Though the present discussion often refers to a YAG host material, it should be understood that the disclosure is in no way limited to YAG or garnet host materials. Other suitable host materials can include the vanadates (e.g., $MVO_4$ where M=Y, Lu or Gd) like yttrium orthovanadate ($YVO_4$), gadolinium vanadate ($GdVO_4$) and lutetium vanadate ($LuVO_4$).

Various mixed combinations of trivalent lanthanides as are known in the art can also serve as a host material for a seed crystal as can oxides including those having the general structure of $M_2O_3$ including scandium oxide ($Sc_2O_3$), lutetium oxide ($Lu_2O_3$), yttrium oxide ($Y_2O_3$), and aluminum oxide ($Al_2O_3$). Suitable host materials can include other garnets and metal oxides as well such as spinels, perovskites, phosphates, vanadates, borates, fluorides and other halides. Host materials are only limited by their stability in the formation process (e.g., hydrothermal fluids), as further described below.

The seed crystal 2 can include a regime formed of an undoped host material or a regime of the seed crystal 2 can be doped with any reasonable concentration of one or more dopants including but not limited to a lanthanide or transition metal ion. By way of example, dopants can include one or more lasing ions including but not limited to neodymium ($Nd^{3+}$), erbium ($Er^{3+}$), ytterbium ($Yb^{3+}$), holmium ($Ho^{3+}$), titanium ($Ti^{3+}$), and thulium ($Tm^{3+}$); and/or one or more ASE suppression ions including but not limited to samarium ($Sm^{3+}$), cobalt ($Co^{3+}$, $Co^{2+}$), chromium ($Cr^{3+}$,$Cr^{4+}$), dysprosium $Dy^{3+}$); and/or one or more Q-switch ions such as $Cr^{4+}$; and/or one or more charge balancing ions; and/or any other desirable dopant ion. In one embodiment, a regime can include multiple dopants including two or more of an activator ion, a Q-switch ion, an ASE control ion, or other combinations of different ion dopants. In general, a regime can include a dopant in a concentration of between about 0.1 at. % and about 20 at. % relative to the host material of the regime.

The seed crystal 2 can be homogeneous or heterogeneous. For instance, in one embodiment, the seed crystal 2 can be formed entirely of an undoped host material crystal regime or can be formed entirely of a host material doped with a dopant ion, e.g., a lasing ion. Alternatively, the seed crystal can be heterogeneous. For example, a seed crystal can be a heterogeneous crystal in the form of a disc (e.g., from about 1 to about 3 centimeters in diameter and up to about 1 cm in length) formed primarily of undoped YAG host material core and including a thin layer (e.g., about 100 to about 300 microns thick) of Yb doped YAG regime over the surface of the undoped core regime. Such a seed crystal can be suitable for thin disk laser applications.

To form a heterogeneous monolithic crystal as described herein, a void 4 can be formed into the seed crystal 2, as shown in FIG. 1. The geometry of the void 4 can include any shape. For instance, the void can be formed in the shape of a circular or ovoid cylinder having a relatively large cross section, as shown, or can be smaller, with a relatively small cross section as compared to the cross sectional dimension of the seed crystal 2. A void can be straight or curved along one or more dimensions as desired and can adopt a cross sectional geometry that mimics that of the seed crystal 2 or differs from that of the seed crystal 2, as desired. The void can extend from a surface 6 of the crystal to a depth I and be otherwise surrounded by the material of the seed crystal 2, as shown in FIG. 1. Alternatively, a void can extend from one surface to another surface and to a predetermined depth such that the void opens on multiple surfaces of the seed crystal as illustrated in further embodiments herein. In one embodiment, the void can have an aspect ratio (I/d, with d being the largest cross sectional dimension of the void along a depth I of the void) of 1 or greater. In other embodiments however, the void can have an aspect ratio of less than 1.

The void 4 can be cut from a surface 6 of the seed crystal 2 and extend to a depth within the interior of the seed crystal 2. In general, the depth I of a void 4 can be such that the seed crystal 2 will not lose integrity and break upon formation of the void 4. For instance, the depth I can be about 90% or less, about 80% or less, about 70% or less, or about 60% or less of the depth L of the seed crystal wherein I and L are measured along the same line within the seed crystal 2.

The void can include the base material of the seed crystal 2 on at least two sides of the void. For instance, in the illustrated embodiment, the dimension d bisects the void 4 to form a first side 11 and a second side 13. The largest width w of the void 4 as measured between the first side 11 and the second side 13 can be less than the width W of the seed crystal 2. For instance, the width w can be about 90% or less, about 80% or less, about 70% or less, or about 60% or less of the width W of the seed crystal wherein w and W are measured along the same line within the seed crystal 2. In one embodiment, the largest cross sectional dimension w of a void extending between two opposing sides of the seed crystal can be about 1 millimeter or less, for instance about 500 micrometers or less in some embodiments, though larger voids are encompassed herein as well. By way of example, a void 4 can have a depth I, and width w independently of from about 30 micrometers to about 300 micrometers in some embodiments. As shown, the dimension w between two opposite sides 11, 13 of the seed crystal can vary across the void 4.

In one embodiment, the void 4 can describe a cross sectional area that remains the same along the depth I of the void. Alternatively, the shape of the void can vary along the depth I that extends from the top surface 6 of the seed crystal 2 to the surface 8 of the void 4 that is on the interior of the seed crystal 2 at the depth I. In any cross sectional plane along the depth I of the void 4, the cross sectional area of the void 4 can generally be about 80% or less, about 70% or less, or about 50% or less of the cross sectional area of the seed crystal 2 in that plane.

The void 4 can be created by any suitable process in which a portion of the formation material of the seed crystal 2 can be removed without damage to the crystal structure of the remaining formation material. For instance, the void 4 can be created by use of mechanical saws (e.g., diamond tipped saws), mechanical milling, ion milling, laser ablation, chemical etching, CNC etching, routering, wire sawing, ablation, or any other method known to practitioners of the art.

Following formation of the void 4, a crystal growth or deposition method can be carried out to develop a new crystalline regime 5 within the void 4. The formation material of the new regime 5 can generally include the same host material as the formation material of the seed crystal 2, and in particular that formation material that is immediately adjacent to the new regime 5. This is not a requirement, however, and in other embodiments, the host material of the new regime 5 and that of the immediately adjacent regime can differ. In general, however the two immediately adjacent materials can have the same host material and the composition of the new regime 5 and that of the immediately adjacent material of the seed crystal 2 can differ from one another only with regard to the presence or quantity of one or more dopants. For instance, the new crystal regime 5 can be formed of a doped host material that includes a dopant such as an activator ion, and the seed crystal 2 can be a homogeneous crystal formed of the undoped host material. The growth method is such that the final product is a single crystal with multiple heterogeneous regimes.

The new regime 5 can completely fill the void 4, as illustrated in FIG. 1, or can partially fill the void 4. For instance, the seed crystal 2 can be processed to include the void 4 and then the void 4 can be completely filled with a new regime 5, creating a heterogeneous monolithic crystal in which the product crystal can include both a remaining regime of the seed crystal 2 and the new regime 5 that differ from one another according to some aspect of composition. The new regime 5 includes the line of bisection d that divides the regime 5 into a first side 21 and a second side 23. The material of the seed crystal is adjacent to both the first side 21 and the opposite second side 23 of the material of the new regime 5. In this particular embodiment, in which the void 4 extends from only the surface 6 of the seed crystal 2, the external regime of the seed crystal 2 can completely surround the new regime 5 along the depth I of the new regime 5. This is not a requirement, however, and in other embodiments, described further herein, the external regime can be adjacent to a first side and an opposite second side of the new crystal regime, but will not necessarily surround the entire new crystal regime along the entire depth of the new crystal regime.

The external regime of the seed crystal 2 can also be adjacent to the bottom 3 of the new regime 5 at the depth I of the void. The composition of the new crystal regime 5 can differ from the composition of the seed crystal 2 such that the product formed is a heterogeneous, monolithic crystal. The growth of the new regime 5 within a void 4 formed in the seed crystal 2 provides a route to the formation of heterogeneous monolithic crystals in which the various regimes can have a complicated geometry.

Following formation of the new regime 5, any excess growth of the material of the regime 5 (for instance on the exterior surface of the seed crystal 2) can be polished away using techniques well known to practitioners. The new regime 5 can thus be within the external regime material, save for any exposed surfaces of the regime 5 at the corresponding surfaces of the remaining seed crystal 2.

The method used to form a new regime within a void of a seed crystal can include any crystalline growth process as is known in the art. For instance, a direct growth method accomplished through epitaxial growth can be utilized. Epitaxial growth methods encompassed herein can include, without limitation, liquid phase epitaxy and hydrothermal growth methods.

According to one particular embodiment, a hydrothermal growth method can be utilized to develop a new regime in a void formed in a seed crystal. A hydrothermal growth method can exploit properties of a hydrothermal fluid to form a new regime on an interior surface of an existing substrate in an economically beneficial fashion. For example, a hydrothermal growth method can be practiced at relatively low temperatures (e.g., about 400° C. to about 650° C.), which can decrease operating costs. In addition, the growth medium is a supercritical fluid having an exceptionally low viscosity, approaching that of a gas. As such, the mobility and penetrating ability of the growth medium can approach that of a gas and can completely wet the surfaces within a void of a seed crystal. Because the hydrothermal fluid can readily penetrate to reach all exposed surfaces of a seed crystal, it can effectively transport solubilized feedstock to all the surfaces and subsequently deposit the feedstock on all surfaces. Appropriate control of temperature differential can create supersaturation conditions that can allow for the growth of a new regime layer both on outside surfaces of a seed crystal and any interior surfaces of a seed crystal within a previously formed void. Moreover, a hydrothermal growth method can form the new regime having the essentially same crystal lattice structure as the adjacent material of the seed crystal 2, e.g., there can be no grain boundary between the two regimes, creating a true single crystal.

Figure 2:
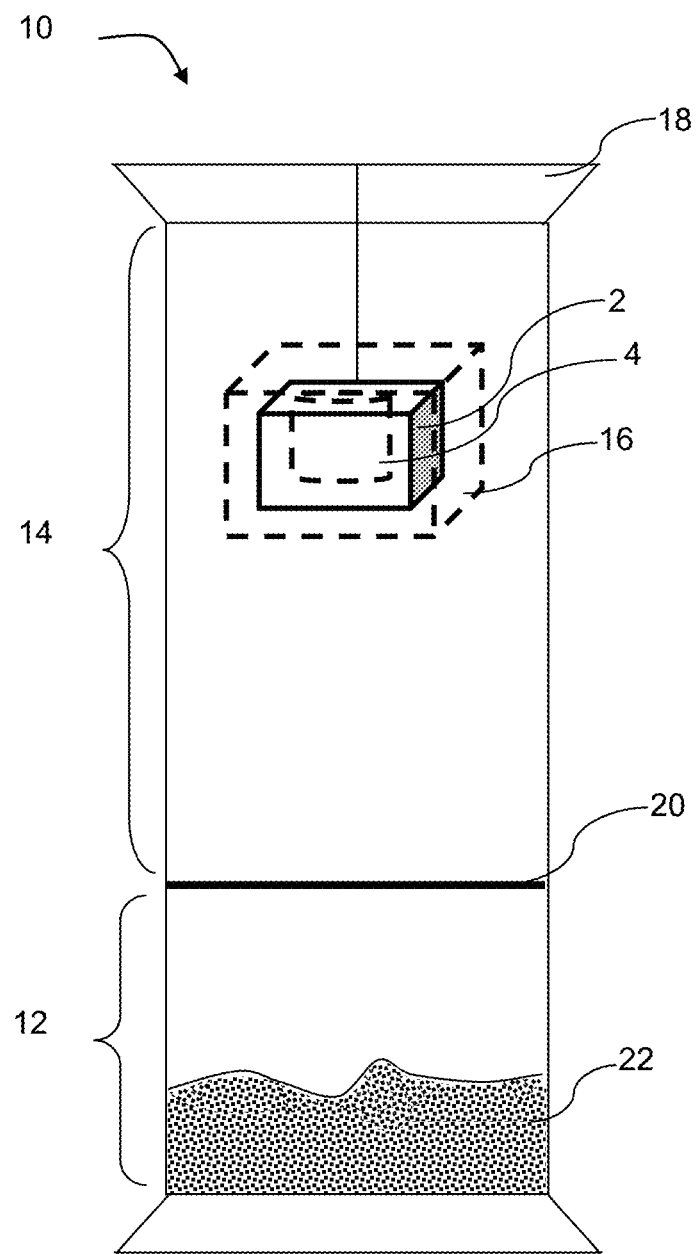
FIG. 2 illustrates a hydrothermal growth system as may be utilized to form a heterogeneous monolithic crystal.

FIG. 2 illustrates one embodiment of a hydrothermal system 10 as may be utilized in a process. In general, a hydrothermal process involves the formation of a superheated aqueous solution (liquid heated above its boiling point) under pressure in a temperature gradient to promote transport of soluble species of a refractory oxide from a nutrient rich zone 12 to a growth zone 14. As the refractory oxide is not sufficiently soluble in the superheated supersaturated solvent, the species will crystallize on the exposed surfaces of a seed crystal 2 defining a void 4 that has been located in the growth zone 14.

A process can generally take place within a reactor 18. Depending on the chemical demands of the specific system, a reactor 18 can be lined with a noble metal such as silver, gold, platinum, palladium, etc. For instance, a liner can be a fixed liner or a floating liner. A fixed liner reactor can be in the form of a stand-alone autoclave that is lined with or formed of a desired material and can carry the reactants, products, etc. When utilizing a floating liner, a smaller structure that is lined with or formed of the desired material and containing the reactants can be held or suspended within a larger autoclave. When a floating liner is used a fluid (usually water) is introduced to the outer space between the floating liner and the remaining space in the autoclave. The degree of fill of the outer space is similar to or greater than the degree of fill in the sealed floating liner such that the pressure in the outer space will always be similar to or greater than that inside the sealed floating liner to prevent bursting. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. In one embodiment, a stand-alone autoclave reactor with either fixed liner or unlined can be between about 1 cm and about 10 cm in a cross sectional dimension and between about 10 cm and about 100 cm in height. A floating liner reactor can generally be smaller, for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a growth zone 14. A baffle 20 can be formed of the same or different material as the wall of the reactor 18. For instance, when considering a silver lined or floating reactor 18, baffle 20 can also be silver or silver lined. Baffle 20 can define at least one aperture for passage of solution from the nutrient rich zone 12 to the growth zone 14. A baffle 20 can aid in maintaining a temperature differential between the two zones and can encourage substantially isothermal characteristics in each zone. Baffle 20 can also restrict convective flow between nutrient rich zone 12 and growth zone 14 and can channel the convective flow across the baffle 20 into a desirable geometry.

System 10 can also include heaters, insulators, controllers, etc. as are generally known in the art (not shown on FIG. 2). Additionally, though illustrated in a vertical arrangement with the nutrient rich zone 12 below the growth zone 14, this is not a requirement of the disclosed process, and the two zones can be located in any suitable location with regard to one another, for instance in a horizontal or any other relationship, as long as a temperature differential between the two can encourage convective flow there between.

According to one embodiment, a seed crystal 2 with a void 4 formed therein can be placed in the growth zone 14 to facilitate crystallization of a dissolved feedstock 22 from a supersaturated solution. A seed crystal can be formed of a doped or undoped host material and can be a homogeneous or heterogeneous crystal as previously discussed. In addition, a seed crystal can include a single void or multiple voids, examples of which are discussed further herein.

A hydrothermal growth process can be carried out with a seed crystal 2 of any suitable size, the size of which is limited generally according to the cross sectional dimensions and length (or height) of the reactor 18. In one embodiment, a seed crystal can be from about 0.1 to about 10 centimeters in length, and from about 0.1 to about 5 centimeters in a cross sectional dimension (e.g., diameter), or larger, as desired. For instance, a seed crystal can be a disc-shaped crystal having a thickness of from about 1 to about 5 millimeters and a diameter of from about 1 to about 5 centimeters.

As discussed above, the void 4 formed in the seed crystal 2 can extend from a surface of the seed crystal 2 to an interior location within the seed crystal (i.e., the void 4 does not pass completely through the seed crystal in at least one direction). The size of the seed crystal 2 can be such in one embodiment such that multiple numbers of voids in various patterns can be formed into the seed crystal 2, which can provide for scale-up of commercial quantities of heterogeneous crystals from one growth run following cutting and polishing of the products.

Provided to a system 10 can be a feedstock 22 located in the nutrient rich zone 12 of reactor 18. An illustrative example of a process is one in which suitably doped YAG feedstock 22 can be transported from the nutrient rich zone 12 in solution to an undoped YAG substrate seed crystal 2 in the growth zone 14 where it can deposit and fill a void 4 with doped YAG in the seed crystal 2. A portion of the doped YAG can also deposit on the outer surface of the seed crystal 2 and form a coating 16. As desired, this coating 16 can be removed via, e.g., polishing following the hydrothermal growth process.

A feedstock 22 can include the host material or sources for forming the host material in a powdered form. For instance, in forming a heterogeneous crystal including a YAG host material, a feedstock can typically include $Y_2O_3$ and excess amounts of $Al_2O_3$ or alternatively premade YAG powder. A feedstock can also include a source for the desired dopant(s) when forming a doped regime. For example, in forming a regime for use as a gain medium, the dopant can be an appropriate activator ion source such as an $Nd^{3+}$ source. Ion sources can include oxides, halides, nitrates or any other suitable salt at the desired concentration as is generally known in the art.

Dopants can be introduced to a regime using appropriate sources in the feedstock (typically the dopant oxide, but alternatively the halide or nitrate salt). Other metal ions can be introduced as desired by the function of the formed crystal regime. By way of example, a saturable absorber ion as may be incorporated as a Q-switch material is divalent cobalt, $Co^{2+}$, for instance in conjunction with a gain medium such as Er doped YAG that operates in a region of about 1.5 to about 1.7 μm. A suitable source of divalent cobalt such as CoO, $CoCl_2$ or similar material can be included in the feedstock 22. Since the divalent $Co^{2+}$ will be substituting for a trivalent ion in the lattice, it is desirable to have a similar amount of a tetravalent co-dopant for charge balance purposes. One possible co-dopant is silicon. In one embodiment, a corresponding amount of $SiO_2$ can be added to the feedstock to balance the $Co^{2+}$ substitution in the Q-switch regime. These additives can be readily mineralized along with the lattice host materials under the hydrothermal growth conditions, and so can be readily incorporated into a regime formed in a void 4.

The aqueous solution used in the hydrothermal process can include a mineralizer that can facilitate dissolution and transport of the feedstock. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ in various concentrations. Control of identity and concentration of a mineralizer can facilitate both the rate and quality of crystal growth. Mineralizers and parameters for their use are well known to those practiced in the art and have been used for the growth a number of crystals used in optics such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known in the art. In general, mineralizer concentration can be greater than about 1 M, for instance mineralizer concentration can vary between about 1M and about 30M, or even higher in some embodiments. In the case of a YAG base material, carbonate mineralizer can be used as mineralizer, for instance in a concentration between about 3M and about 8M. A process including a feedstock mixture of $Yb_2O_3$ and $Lu_2O_3$ can utilize a hydroxide mineralizer, for instance in a concentration between about 10M and about 30M. In another example, Nd doped $YVO_4$ can be grown employing a hydroxide mineralizer at a concentration of between about 1M and about 2M.

During a process, a superheated hydrothermal fluid can be contained in a reactor under pressure, typically between about 5 thousand pounds per square inch (kpsi) and about 30 kpsi. Growth and supersaturation control can be achieved in a process by the use of a differential temperature gradient across a reactor. Referring again to FIG. 2, a nutrient rich zone 12 can be heated and feedstock 22 can dissolve in the hot hydrothermal fluid. The solution in the nutrient rich zone 12 becomes a saturated solution. The growth zone 14 can be held at a slightly lower temperature. Consequently, the solution in the nutrient rich zone 12 can convect through the baffle 20 and into the growth zone 14 where it will cool and become supersaturated. The dissolved feedstock can begin to come out of solution and deposit upon the crystal structure of the seed crystal 2. The process can continue until stopped by temperature or pressure control or the feedstock supply is consumed.

Among the advantages of a hydrothermal crystal growth process are the relatively low operating temperatures. For instance, a growth process can generally be carried out at with upper temperatures of between about 500° C. and about 650° C., or between about 450° C. and about 650° C., which can be 800° C. to 1200° C. lower than a liquid phase epitaxy method, and up to 1500° C. to 2000° C. cooler than a Czochralski pulling method. This can simplify and reduce the cost of operating conditions and drastically minimize the amount of thermal strain regions of a forming crystal. The thermal gradient between the zones of a reactor can likewise vary according to specific materials and growth rates desired, but typically the temperature different between the growth zone 14 and the nutrient rich zone 12 can be from about 20° C. to about 100° C. Control of the temperature difference can impart control of the growth conditions.

In general, growth rate of a developing regime can be between about 1 micrometer and about 5 micrometers per hour, or between about 30 micrometers and about 150 micrometers per day. The identity and concentration of a dopant typically has little effect on the rate of layer growth. Rather, the rate of crystal growth can be controlled by the identity and concentration of a mineralizer as well as the temperature gradient across the reactor and the nature of the host material. The relatively slow growth rates possible can be beneficial as this can allow for precise control of the thickness of the forming crystal. For example, a process can reliably grow a regime at about 2 micrometers per hour or about 25 micrometers per day and can thus be used to grow a regime of about 100 microns over four days. Generally, growth rate can vary between about 1 and about 5 micrometers per hour, with preferred growth conditions for any particular system specific to the particular host lattice. Thus for example, when considering $M_2O_3$ oxide host material, a concentrated hydroxide (about 10M to about 30M) mineralizer can be used and the thermal conditions can be at the high end of the range (lower and upper zones at, e.g., about 600° C. and about 650° C., respectively). In the case of $YVO_4$ a lower concentration (e.g., about 0.1M to about 2M) hydroxide mineralizer can be used at somewhat lower temperatures (e.g., lower and upper zones at about 400° C. and about 480° C.).

The concentration of a dopant in a crystal region can be controlled through the addition of appropriate starting materials as feedstock. For example, the feedstock can include $Y_2O_3$ doped with the appropriate amount of Nd, Yb or other ion in the form of $Nd_xY_{2-x}O_3$. This control provides for the control of performance characteristics and lattice size. More specifically, by use of a hydrothermal growth method, dopant concentration can be maintained at a constant level throughout growth, rather than at an ever-changing concentration throughout growth as in some flux methods. Thus, the formed crystal regime can include the dopant at a constant level throughout the regime, which can provide an improved lattice structure and performance.

Beneficially, once a process is started it can require no operator input over the course of the growth and can be replicated reliably many times. As such, the total time of growth can be of little consequence in the overall production process. Furthermore each growth step is chemically very similar to all the other growth steps and only differs by the compositional identity of the feedstock. As such multiple processes can be performed serially using the same equipment under nearly identical conditions requiring only the recharging of the reactor between steps.

The seed crystal can be placed in the hydrothermal growth fluid and with suitable growth conditions epitaxial layers can be grown to completely fill the void 4 within the substrate seed crystal 2. The process can be applied to a void of any shape or size allowing for the formation of internal heterogeneous regions and a wide variety of shapes. This can lead to the formation of many different and complicated structures with advantageous properties and performance particularly as relates to lasers and other optoelectronic devices.

Figure 3:
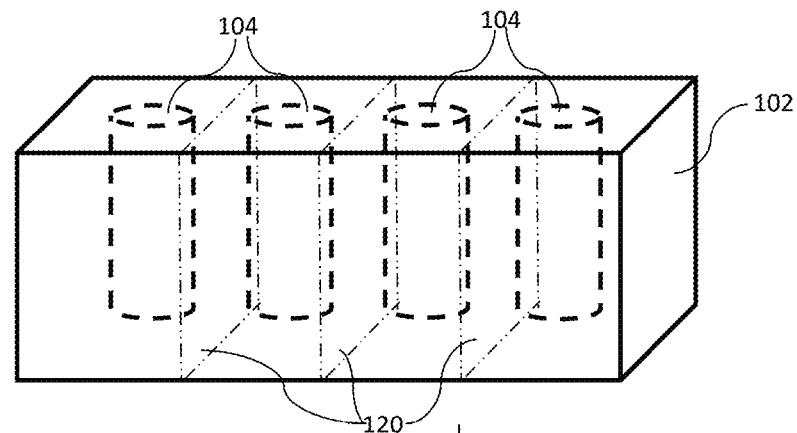
FIG. 3 illustrates one embodiment of a method for forming a plurality of identical heterogeneous monolithic crystals.

Disclosed methods can be readily scaled to the formation of multiple heterogeneous crystals simultaneously merely by utilizing a seed crystal that includes multiple voids. For example, as illustrated in FIG. 3, a seed crystal 102 has been processed to include a plurality of cylindrical voids 104 in the shape of columns. Following the growth process to fill the voids to form a plurality of new regimes 105, the formed crystal can be cut along the planes 120 and polished to form a plurality of heterogeneous crystals 121, each including a newly grown regime 105. Thus, growth time can be minimized. A hydrothermal process provides very uniform, homogeneous and monolithic growth for each column as the regimes 105 can be grown out of highly mobile and homogenous soluble growth solution, and can be used to reliable develop the multifunctional heterogeneous monolithic crystals.

Figure 4:
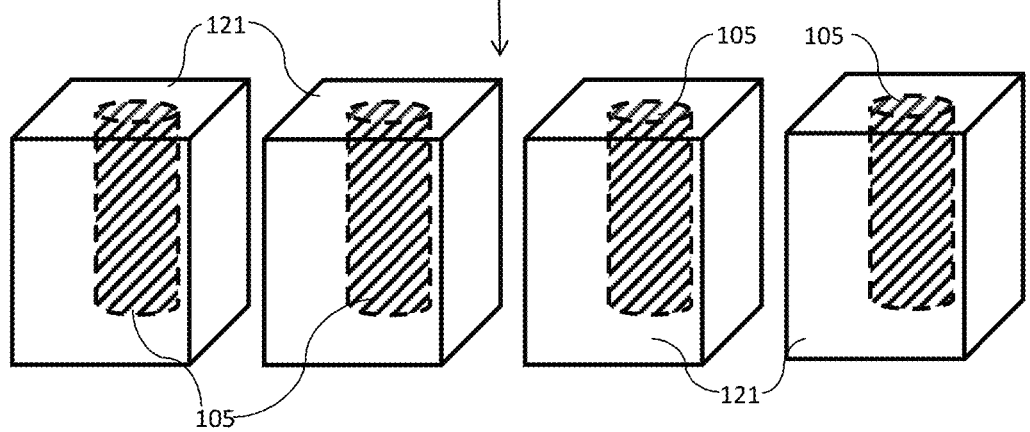
FIG. 4 illustrates one embodiment of a heterogeneous monolithic crystal having multiple identical regimes.
Figure 4:
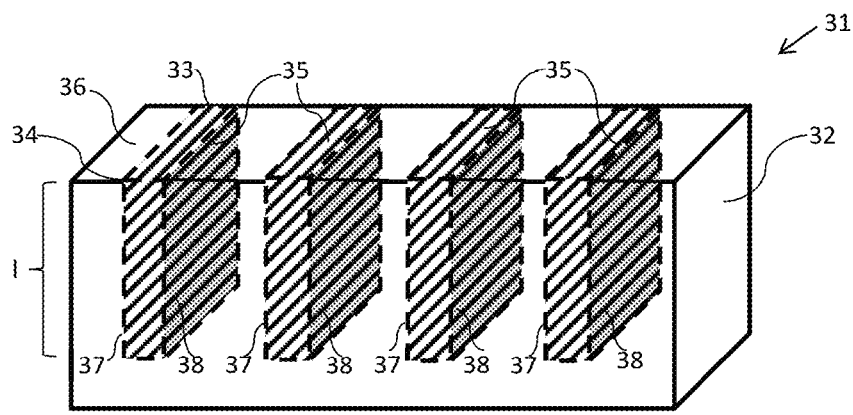

A heterogeneous crystal of any size and shape and including one or multiple identical regimes can be formed. For example, FIG. 4 illustrates a heterogeneous crystal 31 including a regime 32 and a plurality of areas of a second regime 35. As shown, in this embodiment, the new regimes 35 are not cylindrical, as shown in FIG. 3, but rather have a polygonal cross sectional shape and extend from a first surface 36 of the regime 32 to a depth I of the regime 32. In addition, the new regimes extend from a surface 33 of the regime 32 to an opposite surface 34 of the regime 32. The regime 32 is adjacent to a first side 37 and a second opposite side 38 of each regime 35 and is adjacent to the bottom (not shown) of each regime 35 at the depth I. Any shape can be formed for the internal regimes.

The regimes 35 can have the same host material as the regime 32 but can differ with regard to the presence or quantity of dopant. For example, the regime 32 can include an undoped host material such as YAG, and the regimes 35 can include the same host material co-doped with one or more dopant ions. Each ion can be selected to perform a different optoelectronic function.

Figure 5:
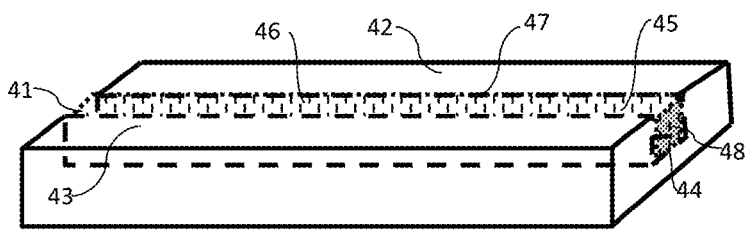
FIG. 5 illustrates one embodiment of a heterogeneous monolithic crystal as may be utilized in a waveguiding or ASE suppression application.

FIG. 5 illustrates an example of a heterogeneous single crystal in which the regime 45 has been deposited such that it extends from multiple surfaces of the external regime 42. Such a heterogeneous single crystal may be utilized in one embodiment in a waveguiding application. As can be seen, in this embodiment the regime 45 has been deposited within a void formed in seed crystal including regime 42. The remaining material of the seed crystal thus forms the regime 42. The deposited regime 45 includes a top 46, an opposite bottom 44, a first side 43, an opposite second side 47, an end 41 and an opposite second end 48. The regime 45 and the regime 42 are adjacent to one another along the bottom 44, the first side 43 and the second side 47 of the regime 42, while the top 46, first end 41, and second end 48 are not enclosed by the regime 42. Thus the external regime 42 can be said to partially enclose the inner regime 45, and photons within the inner regime 45 can be guided and pass through the regime 45, for instance from first end 41 to second end 48.

Figure 6:
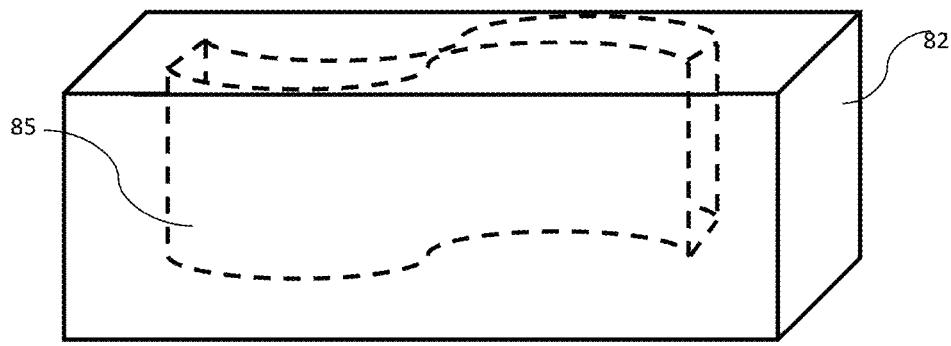
FIG. 6 illustrates one embodiment of a heterogeneous monolithic crystal having an internal regime describing multiple curvatures.

The voids cut into a seed crystal and thus the regimes deposited within the seed crystal voids need not be linear and can include nonlinear components. For instance, the voids/new regimes be circular, oval or other shapes. By way of example, FIG. 6 illustrates a monolithic heterogeneous crystal including outer regime 82 and inner regime 85. As can be seen, inner regime 85 defines multiple curvatures. Any shape that can be cut out of a seed crystal can be filled with one or more deposited crystalline materials to form a heterogeneous monolithic crystal.

For example, a circular void formed in a seed crystal can be filled with one or more heterogeneously doped regions to create circular regimes embedded within an outer regime. The single formed heterogeneous crystal can be subsequently cut and processed according to procedures well known to experts in the field to form multiple doped single crystals with circular or other shaped heterogeneous regimes. Such devices can confer improved performance on optoelectronic applications to a final product.

Non-linear shaped voids can be formed using classical mechanical techniques such as those described previously. For example, a complicated shape including one or more curvatures can be etched into a seed crystal using computer assisted design ablation or CNC (computer numeric control) or similar technology. A non-linear void can be filled with a new regime to form a single crystal with a non-linear regime grown within that can provide performance advantages. For example, a non-linear void and subsequent regime grown therein can be created so as to optimize the ASE suppression in a laser crystal.

A heterogeneous crystal can include surface coatings that can overlie all or a portion of other regimes of the crystal. For instance, following development of one or more interior regimes (that can be the same or different from one another), optionally followed by polishing, cutting, etc., the thus-formed heterogeneous crystal can be subjected to another crystal growth process during which an overgrowth of an additional layer of material can be formed on the surface of the crystal.

Figure 7:
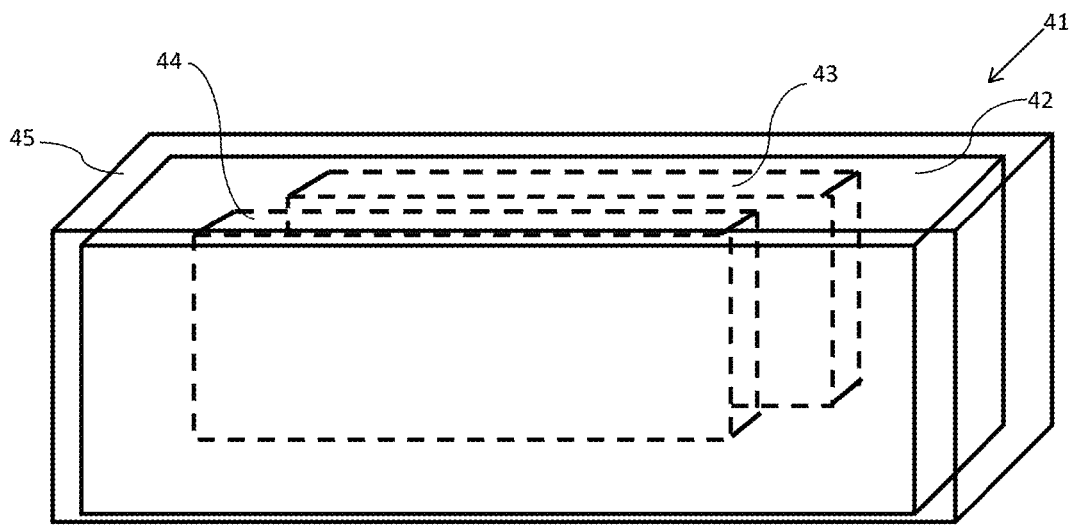
FIG. 7 illustrates one embodiment of a heterogeneous monolithic crystal having multiple different regimes.

FIG. 7 illustrates one such embodiment of a heterogeneous monolithic crystal 41. The crystal 41 includes a first regime 42 within which a second regime 43 and a third regime 44 have been grown. For example, regime 42 can be the remaining portion of a seed crystal from which voids were cut. Regime 43 and regime 44 can be the new regimes that were subsequently grown (e.g., via a hydrothermal growth method) within the voids. Regime 43 and regime 44 can be of the same composition as one another or can differ from one another with regard to presence and/or amount of one or more dopants. For example, to form different regimes, a first void can be formed in a seed crystal followed by growth of regime 43 and subsequently a second void can be formed in the seed crystal at a second location followed by development of regime 44. The regimes 42, 43, and 44 can generally include the same host material the regimes 43 and 44 independently can differ from the regime 42 with regard to the quantity or presence of one or more dopants.

Following formation of the regimes 42, 43, and 44, the heterogeneous crystal can then be subjected to another crystal growth process during with a capping layer 45 can be grown over the other regimes. The capping layer can provide an optical function to the heterogeneous crystal and/or can provide a mechanical function, a thermal control function, or any other function or combination of functions to the heterogeneous crystal. In one embodiment, the capping layer 45 can include the same host material as the other regimes and can have the same or different composition as one or more of the other regimes of the heterogeneous crystal 41. For example, capping layer 45 can be formed of an undoped host material and an act as an endcap, a waveguide cladding layer, or a substrate to provide strength and/or contact to a heat sink.

Capping layer 45 can be of the same material of formation as one or more other regimes of the crystal. For example, capping layer 45 and regime 42 can both be formed of an undoped host material and regime 43 and regime 44 can be formed of a material that includes the host material doped with one or more dopants. In this embodiment, regimes 43 and 44 can thus be completely encapsulated by the undoped host material.

In one embodiment, following formation of a regime within a void of a seed crystal to form an initial heterogeneous crystal, the formation process can be repeated using the heterogeneous crystal thus formed as a new heterogeneous seed crystal. For example, the heterogeneous seed crystal can be subjected to a formation process in which one or more voids are formed in the heterogeneous seed crystal, and a second growth process is then carried out to fill this new void with a new regime. The formation process can then be repeated to form multiple different regimes, each of which can have any desired geometry within the crystal substrate.

Figure 8:
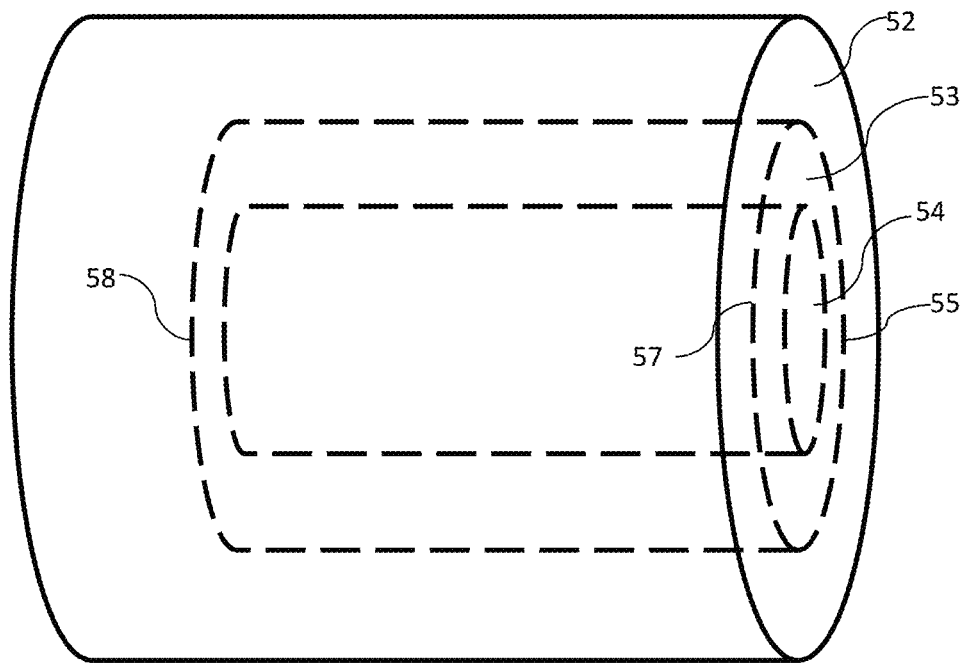
FIG. 8 illustrates one embodiment of a heterogeneous monolithic crystal having multiple concentric regimes.

In one embodiment, illustrated in FIG. 8, multiple different regimes can be formed so as to be concentric with one another. In such an embodiment, a first regime 52 can be the remaining material of an original seed crystal. According to the formation process, a first void can be formed in the regime 52. This original seed crystal can then be subjected to a growth method, during which regime 53 can grow within the void such that opposing sides 55, 57 and the bottom 58 of the regime 53 are adjacent to the external regime 52. Depending upon the growth time, etc., the formation material of regime 53 can fill or partially fill this void. The heterogeneous crystal thus formed that includes regime 52 and regime 53 can then be utilized as a heterogeneous seed crystal for formation of additional regimes.

For example, in those embodiments in which the formation material of regime 53 only partially fills the original void in the original seed crystal, a second growth process can be carried out using the heterogeneous seed crystal as formed or as surface polished. During the second growth process, the formation material of regime 54 can fill the remainder of the void.

In one embodiment, the heterogeneous seed crystal formed in the first growth process can be further processed prior to the second growth process to form a new void. For instance, if the formation material of regime 53 fills the original void of the original seed crystal, a material removal process can be carried out, during which a new void can be formed in the formation material of the regime 53 (and optionally extending into the formation material of the regime 52). In the illustrated embodiment, this second void can be slightly smaller than the volume filled by the material of regime 53 during the first growth process. A second growth process can then be carried out, during which this void can be filled with the material of regime 54.

The material removal and growth processes can be repeated multiple times as desired, each time cutting a successively smaller void in the previously formed material followed by growth using a different feedstock.

A material removal process between growth processes can also include removal of material grown on the external surfaces of the seed crystal, for instance by use of known polishing methods, before the next void formation and growth process. Polishing of external surfaces between growth processes can utilize low precision polishing, as it can be used merely to reestablish approximately the original seed surface. Such polishing can be accomplished for example by using gem faceting equipment as is known in the art. Of course, higher polishing quality can optionally be obtained at intermediate material removal steps. A final polishing step following completion of the final product, for instance prior to use of a heterogeneous crystal in lasing, can require higher parameters to be met. For instance, optical flatness and parallelism in a final product may be desired. Such final processing can be performed by those skilled in the art according to standard methods as known for typical crystals as currently utilized.

A final growth process can optionally be carried out to form a capping layer over all or a portion of the multi-regime heterogeneous crystal thus formed, as previously described.

Figure 9:
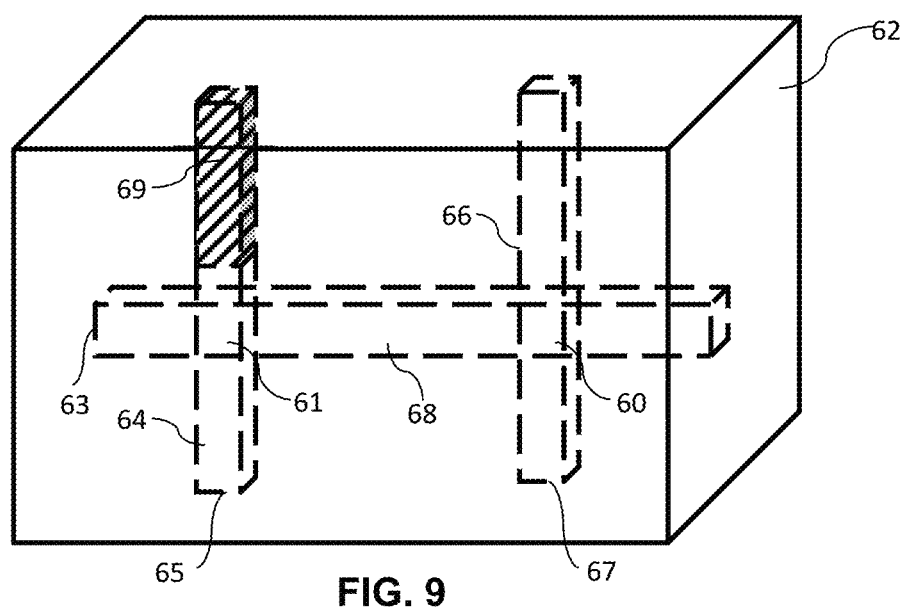
FIG. 9 illustrates one embodiment of a heterogeneous monolithic crystal including intersecting regimes.

In one embodiment, regimes formed in a seed crystal can intersect one another. For example, and as illustrated in FIG. 9, a first regime 62 can generally be considered to be an external regime that is adjacent to at least a portion of the internal regimes 64, 66, 68, 69. Specifically, the external regime 62 can be adjacent to at least two opposing sides and the lower ends 63, 65, 67 of regimes 64, 66, 68, as shown. As shown, the regimes 64, 66, 68 have been formed such that there are areas of intersection 61, 60 within the external regime 62. These areas of intersection can be filled with the latter formed regime, in those embodiments in which the internal regimes 64, 66, 68 are formed of two or more different materials of formation.

In one embodiment, a single void of a seed crystal can be filled with two different materials. For instance, and with reference to FIG. 9, one regime 64 can be formed as part of the depth of the original void. The second length of the original void can be filed to form a regime 69 that can differ in composition from both regime 64 and regime 62. The difference in quantity and/or presence of one or more dopants in the regimes 64, 69 can provide a different optical function to the different regimes. Thus the monolithic heterogeneous single crystal can for example exhibit different lasing wavelengths in the same crystal. Further devices are encompassed that are single crystals and contain multiple segments with multiple dopant combinations in adjacent internal areas of an external regime formed from a seed crystal.

Figure 10:
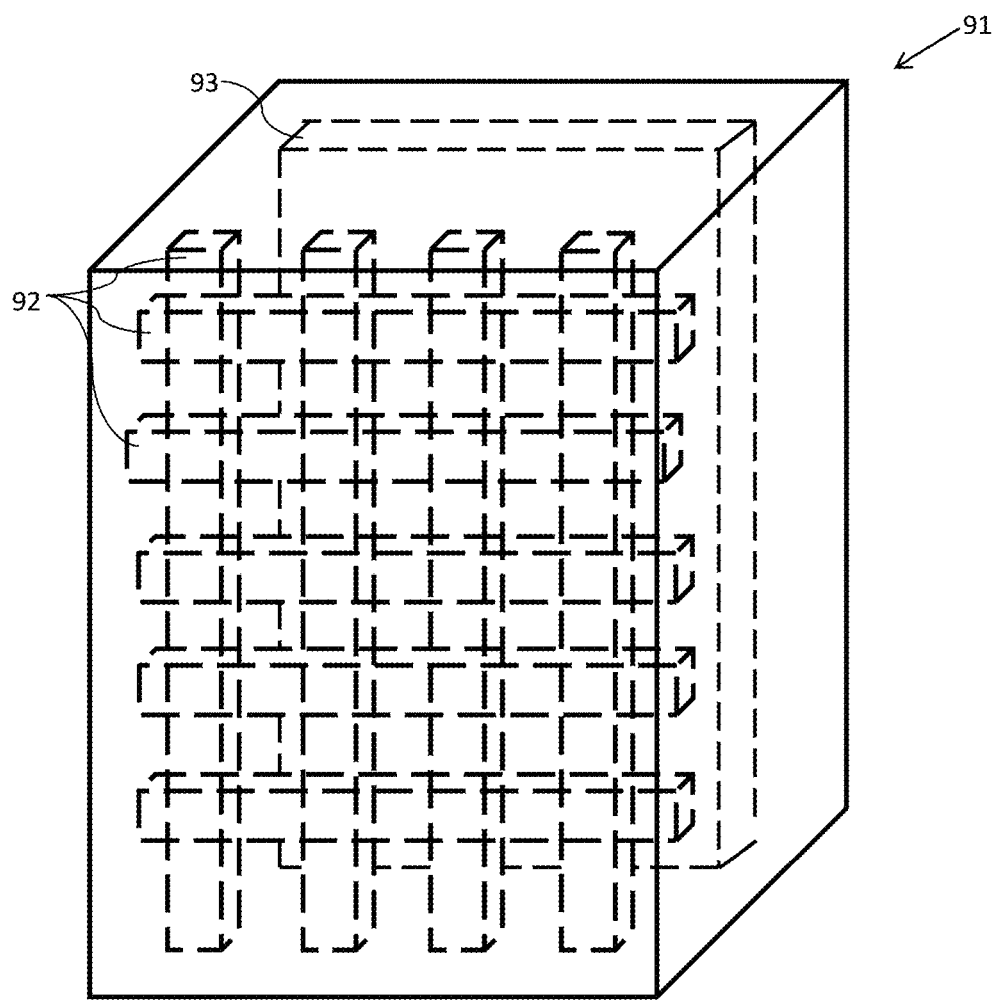
FIG. 10 illustrates one embodiment of a heterogeneous monolithic crystal having a complicated geometry of multiple regimes.

FIG. 10 illustrates another embodiment of a heterogeneous monolithic crystal including a series of intersecting regimes 92, each of which can independently be the same or different composition from one another, and a regime 93 of a different shape and at a distance from the regimes 92.

Figure 11:
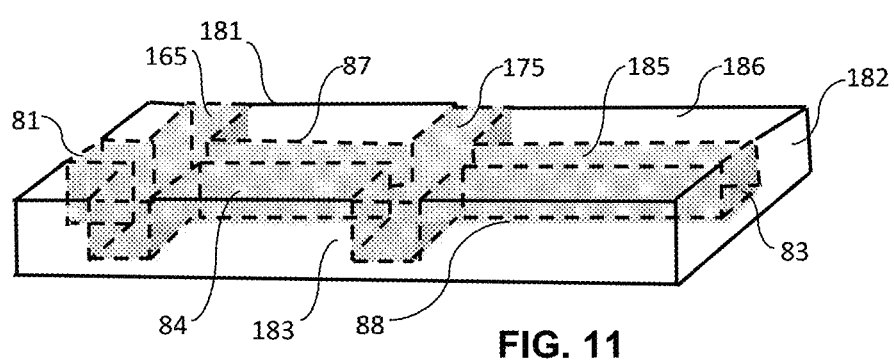
FIG. 11 illustrates one embodiment of a heterogeneous monolithic crystal include intersecting regimes suitable for use in waveguiding or ASE suppression applications.

FIG. 11 illustrates yet another embodiment of a heterogeneous monolithic crystal in which multiple interior intersecting regimes can be deposited within the voids formed in the seed crystal regime 182. For instance, regime 185 extends from a first end 81 to a second opposite end 83 of the regime 182 with a first side 84, a second side 87, and the bottom 88 of the regime 185 adjacent to the regime 82. Regime 175 and regime 165 are likewise formed within the external regime 182 such that they extend from one side 181 to an opposite side 183 of the regime 182 and from the surface 186 of the regime 182 to a depth within the regime 182, as shown. For instance, each of the intersecting internal regimes 185, 165, 175 (i.e., those that are adjacent on at least a first side, a second opposite side, and a bottom to another external regime 182) can function in a waveguiding application.

The different internal regimes 185, 165, 175 can independently be formed of the same or different compositions, as desired, though they can generally all include the same host material. In those embodiments in which all of the areas are filled with an identical material, the different areas 185, 165, 175 can be said to form a single regime. In the intersections of the regimes 185, 165, 175, the formation material can be exclusively a single deposited regime material or can incorporate two different materials. In this embodiment, a first regime material can be deposited and processed as necessary to partially fill the void and a second regime material can then be deposited in the remaining void, as discussed previously.

Large variation in numbers, shapes, and compositions of regimes can be utilized to form heterogeneous monolithic crystals with finely engineered characteristics. Formation methods described herein provide a route to multifunctional single crystal laser gain mediums with one or more different regimes that can serve as thermal buffers, ASE suppressors or any other optical, thermal, or mechanical function. The regimes can be formed with varying thickness, refractive indices and doping ion concentration. The regimes can be designed to improve lasing performance of a gain medium device.

Following formation of all desired regimes, a product monolithic heterogeneous crystal can be cut, polished, and further processed as desired. For example, one or more faces of the heterogeneous crystal can be coated with appropriate reflective and/or antireflective coatings appropriate for the desired applications. In one embodiment the crystal can be inserted into a laser resonator cavity using mirrors to create free space optics for a laser resonator cavity. Any designs of pumped solid state lasers as are well known to practitioners of solid state laser design can beneficially incorporate the monolithic heterogeneous crystals.

In one embodiment, a product crystal can be cut, polished and further processed to form a heterogeneous monolithic crystal for use in amplified spontaneous emission (ASE) suppression, for instance in thin disc lasers. For example a single crystal substrate including one or more regimes of undoped host material (e.g., YAG) and one or more regimes doped with an appropriate lasing ion (e.g., Yb-doped YAG) can have one or more voids formed in the surface of the disk that can then be filled according to a crystal growth method with YAG doped with one or more ASE suppression ions (e.g., $Co^{3+}$). The ASE suppression regime thus formed can be specifically designed with a geometry so as to maximize ASE suppression (see, e.g., U.S. Pat. No. 8,509,281 to Galasso et al., which is incorporated herein by reference)

Heterogeneous monolithic crystals containing the internally grown regimes can include regimes with any of a number of optoelectronic functions related to lasing and can serve as components of solid-state lasers. For instance, the crystals can be utilized in thin disk lasers with ASE suppression, waveguide lasers, microlasers, crystal fiber lasers, and gradient doped lasers.

Prophetic Example 1

A YAG crystal having 10 mm×10 mm faces with a thickness of 1 mm can have a rectangular void cut into it with a width and depth of 100 microns and length of 100 microns. This void can be subsequently filled with the host oxide doped with a lasing ion such as 1 at. % $Nd^{3+}$:YAG according to a hydrothermal growth process. After polishing the top surface back to its original structure to remove the extraneous surface, the resultant product is a single crystal with a 0.1 mm×0.1 mm column of 10 mm in length that can serve as the gain path. If a longer path length is desired a longer original substrate YAG seed can be used. If a smaller or larger column is desired, the void can be cut to the smaller or larger dimensions. The process can provide simple and detailed control of lateral size and path length of the laser gain medium.

The product can be further modified by employing the formed crystal as a substrate seed in another hydrothermal growth process with a growth medium containing undoped YAG feedstock. This material can be grown on the surface of the product to create a single crystal including the fully embedded column of doped YAG contained within undoped YAG host material. The final product can serve as a one dimensional single crystal waveguide laser gain medium. Since the length of the filled void is only limited by the size of the seed crystal, a product can be used as waveguide devices that function as crystalline fiber waveguide lasers.

Prophetic Example 2

A seed crystal formed of 15 at. % $Sm^{3+}$ doped YAG can have one or more voids cut into it of 2 mm depth×2 mm width×2 mm length and 1 at. % Nd:YAG grown in the voids by a hydrothermal growth process. After polishing the surface, an additional layer of Sm:YAG can be grown on the top of the thus formed crystal surfaces. The heterogeneous crystal can then be cut parallel to newly formed regimes such that the Sm:YAG regime is bisected. The final product in this case is a heterogeneously doped single crystal device with an inner lasing column of 1 at. % Nd:YAG capable of lasing at various wavelengths including 1.064 µm, with an outer surrounding regime of 15 at. % Sm:YAG where $Sm^{3+}$ has an absorption band at 1.064 µm. Since both the outer cladding and the inner column are formed of very closely related materials (lanthanide doped YAG) they will have similar refractive indices. Thus any stray spontaneously emitted photons emitted around 1.06 μm can be absorbed in the outer Sm doped layer causing them to relax thermally and not reflect back into the lasing cavity. This can remove or minimize ASE.

Prophetic Example 3

A heterogeneously doped single crystal can be formed with three concentric layers whereby the outer ring is Sm doped YAG for ASE suppression and the inner ring is 1 at. % Nd doped YAG for lasing. Another layer is included between the lasing column and the ASE suppression layer that is undoped YAG with a modest thickness of perhaps 100-250 μm. The undoped ring acts as a buffer to thermal distortion, so that any heating by the Sm doped layer does not induce distortion that is transmitted to the laser gain material causing beam degradation due to thermal effects.

The refractive index of the column of laser gain medium can be modified during the original growth step by using a feedstock in a hydrothermal growth process that in addition to the laser gain ions ($Nd^{3+}$) also contains some concentration of an optically benign ion that does not otherwise affect the optical properties but does increase the refractive index of the host material. This can increase the refractive index of the material and correspondingly increase the total internal reflection of the material to beneficially alter its waveguide performance. Typical ions that serve this function are $Gd^{3+}$ and $Lu^{3+}$.

For example, the feedstock can include 1 at. % Nd:10 at. % Lu doped $Y_2O_3$, along with excess $Al_2O_3$ to grow a column in the void of 1 at. % Nd; 10 at. % Lu doped YAG that lases in similar fashion to 1 at. % Nd:YAG but contains an increased total internal reflection. Since the length of the laser region is only limited by the length of the original seed crystal, devices of multiple centimeters can be grown economically. A thin void of suitable length can form a heterogeneous crystal known as a single crystal fiber laser. Also since multiple voids can be etched into the original seed crystal and all such voids can be filled during a single growth process, the process can be readily scaled up to large scale commercial production.

Prophetic Example 4

Two or more concentric layers containing successively decreasing values of a laser dopant ion in each layer can be formed within a seed crystal. This can be accomplished by forming a void in a seed crystal that includes YAG or other suitable host material. The void can be 2 mm wide×2 mm deep×2 mm long. By hydrothermal growth the void can be filled using a feedstock of 3 at. % Yb:$Y_2O_3$ and $Al_2O_3$. After growth and surface polishing, a void of 1.5 mm wide×1.5 mm deep×1.5 mm long can be cut in the previously formed regime. This void can be filled using a feedstock of 7 at. % Yb:$Y_2O_3$ and $Al_2O_3$. The process is repeated with a void of 1 mm wide×1 mm deep×1 mm long and a feedstock of 10 at. % Yb:$Y_2O_3$ and $Al_2O_3$. After the growth and surface polishing to original flatness, a layer of 7 at. % YAG can be grown on the top of the flat surface followed by a layer of 3 at. % Yb:YAG using a hydrothermal method.

After suitable polishing the final product can be utilized as an embedded laser gain medium with a gradient doping of lasing ions whereby the gradient of the laser active ions decreases in a concentric fashion from the center line of the voids. The heterogeneous crystal can be further processed by heating to a temperature above 1000° C. but below 2000° C. for a suitable period to diffuse the laser dopant ions slightly to create a smooth doping profile of the lasing ions.

Prophetic Example 5

A thin disk (1-3 cm diameter and 5 mm thickness for example) of a suitable host material (such as YAG or $Lu_3Al_5O_{12}$) doped with a thin layer of lasing ion ($Yb^{3+}$ for example) to serve as a thin disk laser can be utilized as a seed crystal. The thin disk can have voids cut into the surface of the disk to at least the depth of the dopant level. These voids can then be filled according to a hydrothermal growth process. The feedstock an contain suitable concentrations of an ion that can serve as an ASE suppressant (for example $Sm^{3+}$, $Dy^{3+}$, $Co^{3+}$ or $Cr^{4+}$). The void pattern can be designed to provide highly efficient ASE suppression.

The heterogeneous crystal thus formed can serve as an efficient lasing disk for high power thin disk lasers, of which there are many designs known to the field.

Prophetic Example 6

A column can be formed within a seed crystal containing a host material that is doped with both a lasing ion and a passive Q-switching ion (also referred to as a saturable absorber ion). This combination can induce high-powered pulsed lasing in the same region. The Q-switch induces pulsing by preventing lasing until saturation is achieved at which point the absorber medium becomes transparent and the resultant pulse contains all the pump power built up during the saturation. As is known, when the lasing ion and the saturable absorber are co-doped within the same lattice in appropriate concentrations the phenomenon of spectral hole-burning induces high peak power, single longitudinal mode lasing emission and polarization of the laser light.

For laser emission in the 1 micron range the saturable absorber can be $Cr^{4+}$. Since the $Cr^{4+}$ is often replacing a trivalent ion in the host lattice ($Al^{3+}$ in YAG for example), an equimolar amount of a divalent ion such as $Ca^{2+}$ or $Mg^{2+}$ can also be co-doped into the lattice to balance charge.

For example, a void can be cut into a crystal substrate such as YAG of desired dimensions. The feedstock for a hydrothermal growth process can include material suitable for doped YAG growth, (for example 1 at. % $Nd^{3+}$ or 5 at. % $Yb^{3+}$) along with a suitable amount $Cr^{3+}$ and a matching amount of $Ca^{2+}$ or $Sr^{2+}$ as a counterion (for example 0.1 at. % of $CrCl_3$ and an equimolar amount of $CaCl_2$). Upon growth under suitable hydrothermal conditions the void can be filled with YAG doped with a lasing ion such as 1 at. % $Nd^{3+}$ or 5 at. % $Yb^{3+}$, 0.1 at. % $Cr^{3+}$ and 0.1 at. % $Ca^{2+}$.

Such a material contains a defect in the lattice and upon heating to 1000° C. for 24 hours or less in air results in elimination of the defect along with oxidation of the $Cr^{3+}$ to $Cr^{4+}$ and migration of the $Cr^{4+}$ from a six coordinate site in the YAG lattice to a four coordinate site in the lattice. This serves as a saturable absorber passive Q-switch. After polishing and standard laser crystal processing the product is a crystal column of desired lateral dimensions and length co-doped with both a lasing ion and the saturable absorber. The product is capable of acting as a pulsed solid-state laser gain medium with high peak power and single mode polarized laser emission. The peak power, energy pulse width and repetition rate can be controlled by the usual factors for saturable absorber solid-state lasers. These factors can include the $Cr^{4+}$ concentration, the pump power and path length.

Prophetic Example 7

Other related devices can be grown that, in addition to regimes co-doped with laser ions and Q-switching ions, also contain multiple regimes such as concentric rings for thermal management and ASE suppression and also contain undoped endcaps to minimize thermal lensing. As a non-limiting example, a central column can be grown containing YAG doped with both $Nd^{3+}$ as a lasing ion along with $Cr^{4+}$ and $Ca^{2+}$ also included in the lattice to serve as saturable absorber Q-switch and counter ion charge balance respectively. A second concentric layer can be included in the device to suppress ASE and another concentric ring between these two rings can be included optionally to minimize thermal distortion. Also the device can contain undoped endcaps grown to minimize thermal damage at the surface. The device can contain a variety dopant concentrations but a typical concentration of 1-2 at. % $Nd^{3+}$ while an illustrative $Cr^{4+}$ concentration can be 0.1-0.3 at. %. Such a device can be produced using the hydrothermal growth of successive voids as described above.

Prophetic Example 8

A device can be produced with $Yb^{3+}$ doped into one or more voids to serve as laser gain medium in higher concentrations than for $Nd^{3+}$ (e.g., up to about 10 at. % Yb and from about 1 at. % to about 2 at. % Nd. Lasing ions at other wavelengths can be co-doped with other Q switch ions known to experts in the field. For example $Er^{3+}$:YAG can be also doped with $Co^{2+}$ (and $Si^{4+}$ to balance charge) where $Er^{3+}$ is known to emit laser radiation near 1.55 microns and $Co^{2+}$ is known to act as a saturable absorber passive Q switch for lasers operating near 1.55 microns. Similarly the voids can be grown with $Tm^{3+}$ or $Ho^{3+}$ of various combinations and concentrations of either or both ion for lasing in the eye safe region around 2 microns.

Prophetic Example 9

A YAG-based single crystal of 1 $cm^2$ surface area or greater, a size which is only limited by the size of the autoclave, (e.g., up to about 10 cm by about 50 cm) and any desired thickness greater than the desired void, such as about 3 mm in one embodiment, can employed. It can be cut with one or many voids to any desired width and depth, about 300 µm in depth in one embodiment. The feedstock for a hydrothermal growth process can include a composition of 1 at. % $Nd:Y_2O_3$ and excess sapphire ($Al_2O_3$) in $2MK_2CO_3$ in water, or 10 at. % $Yb:Y_2O_3$ and excess sapphire ($Al_2O_3$) in $2MK_2CO_3$ in water, or 0.4 at. % $Er:Y_2O_3$ and excess sapphire ($Al_2O_3$) in $2MK_2CO_3$ in water. The seed crystal can remain in the growth solution until the voids are grown full during the growth period (e.g., between about 3 and about 15 days depending on the size of the voids). All of the external surfaces of the seed crystal will also be grown upon, but the surfaces can subsequently polished to their original surface using techniques known to the art. The product crystal is a YAG single crystal with a number of columns each doped with suitable concentration of a laser ion of either 1 at. % Nd:YAG, 10 at. % Yb:YAG, or 0.4 at. % Er:YAG embedded within the surface. Each column can be cut away from the others to form plurality of solid-state lasing gain mediums, each approximately the surface area of the original void.

Each of these crystals can then be placed in another autoclave under similar hydrothermal growth circumstances whereby the feedstock in this case consists only of undoped host materials such as $Y_2O_3$ and excess $Al_2O_3$. After growth a layer of YAG about 1 mm in thickness can be deposited on the crystal. After polishing according to methods well known to practitioners, a heterogeneous crystal is created that is a single crystal containing a column of doped laser medium fully embedded in undoped host material. This device can then be used as low dimensional waveguide laser medium.

As further aspect, the crystal can be cut laterally at an edge to form avoid having a depth approximating the depth of the internal regime and a width of approximately 1 mm. This seed crystal can then be subjected to a hydrothermal growth fluid containing only undoped feedstock source. After growth of several millimeters of undoped host material and polishing, a device is produced that is a single crystal containing a fully embedded column of laser ion doped material that also contains undoped endcaps. The device can be employed in lasing devices as a low dimensional single crystal waveguide laser with endcaps.

Prophetic Example 10

A YAG substrate of 20 mm×50 mm×3 mm can have a number of voids cut into it of a suitable depth and width such as 2 mm×2 mm. The seed crystal can be placed in an autoclave with a feedstock including 15 at. % $Sm:Y_2O_3$, excess $Al_2O_3$ and $2M K_2CO_3$. After hydrothermal growth in which the growth reaction is maintained until the voids are grown full with 15 at. % Sm:YAG (e.g., about 12-15 days), the crystal surface is polished back to its original surface. Each now-filled void is then cut again out with a saw or cutter with a slightly smaller void, to create a void of about 1 mm×1 mm in depth and width. The crystal is then placed in an autoclave under similar conditions above except the feedstock includes 1 at. % $Nd:Y_2O_3$ and $Al_2O_3$. The new void in the crystal can be grown full of the host material doped with $Nd^{3+}$ laser gain ion. After polishing the surface to its original level the heterogeneous crystal includes concentric layers of ASE suppression cladding along with a core of lasing gain medium. The path length of the laser gain medium can be controlled by the dimension of the original substrate seed. For instance, a 20 mm long seed plate can generate a 20 mm path length.

Subsequent to these steps the crystal can be placed in an autoclave with elements of an ASE suppression feedstock (15 at. % $Sm_2O_3$, $Y_2O_3$ and $Al_2O_3$). During a growth process, a layer of ASE cladding (1-2 mm thick) is grown on top of the previously filled voids that contain the laser gain medium. After growth and polishing, the product crystal includes multiple areas of a laser gain medium each with a concentric ASE cladding layer. Such crystals can be optically polished to flat, parallel faces and coated with dielectric coatings as well known to practitioners of the art. This process has the advantage of simple inexpensive scale-up of complex single crystals, and the further advantage that all the devices contain exactly the same amounts of dopant ions since they are grown in the same fluid.

Prophetic Example 11

A series of concentric layers can be grown by cutting voids with sequentially decreasing diameter after each growth. Each growth step can then occur using a sequentially increasing concentration of dopants. For instance, an initial void can be drilled in undoped YAG with a 2.5 mm diameter and grown full with 3 at. % Yb:YAG. This growth can be drilled with a 2 mm diameter drill and grown full with 7 at. % Yb:YAG. This growth can be drilled with a 1 mm diameter drill and grown full with 11 at. % Yb:YAG. This can be augmented by further growth of undoped endcaps. The cumulative effect is to create a device containing a laser gain medium with concentric rings of decreasing dopant concentration to minimize thermal distortions or other effects.

Prophetic Example 12

Thin disks with complex doping zones can be formed to maximize ASE suppression on thin disk lasers. In this embodiment a disk of the desired laser host material is used as the seed crystal. The seed crystal can have several dopant zones. For example it can have a garnet host material such as YAG or LuAG and include several layers of varying concentrations of lasing ion such as $Yb^{3+}$. Thus the seed crystal can be a 1-3 cm diameter disk with a central 1 mm thick undoped garnet core, a first 35 micron layer of 3 at. % Yb:YAG external to the core, a second 35 micron layer of 10 at. % Yb:YAG external to the first layer, a third 35 micron thick layer of 3 at. % Yb:YAG external to the second layer, and a 50 micron thick layer of undoped YAG on the surface. Such a multifunctional substrate can be prepared by hydrothermal epitaxial growth to form each successive layer. This seed crystal can be etched, milled or ablated with a pattern of voids about 250 microns deep, the pattern being specifically designed to maximize ASE suppression in the disk during high power thin disk laser operation.

The seed crystal disk with voids cut therein can be placed in a hydrothermal growth reactor with feedstock suitable to grow the voids full with host material doped with ASE suppression ions. For example the feedstock can include YAG feedstock doped with 5-15 at. % $Co^{3+}$ ions, which is a good $Yb^{3+}$ ASE suppressant. Such a multifunctional disk after suitable polishing and coating can serve as lasing crystals for high power thin disk of any of the thin disk laser devices known to the field.

Prophetic Example 13

A waveguide laser crystal can be formed by formation of a void of a diameter sized to induce only single mode or low mode lasing. This diameter can be for example, from about 50 to about 100 micrometers. The seed crystal host material can be such that it contains a particular refractive index, $\eta$, such as YAG ($\eta=1.810$) and the void can be grown full with a material that fulfills three criteria:

1) it can contain the lasing ion in the desired concentration;
2) it can have a lattice type that is similar in size and structure to that of the seed crystal; and
3) it can have a refractive index that is greater than the seed crystal material that surrounds the new regime material.

This can be accomplished using as example a host material that contains some concentrations of $Lu^{3+}$ replacing $Y^{3+}$ along with the dopant lasing ion as in 10 at. % $Yb:Lu_xY_{3-x}Al_5O_{12}$. The resultant lattice can be a sufficiently close match in size and type to the parent YAG so that the final product can be a monolithic single crystal with one or more columns filled with the waveguide material. However the presence of the heavier, more polarizable ions in the column (Lu and Yb) can increase the refractive index of the grown column, wherein $\eta=1.815$ approximately, to create a linear waveguide capable of single mode lasing.

Prophetic Example 14

A void can be cut in YAG or other garnet and then filled in a hydrothermal growth process using a feedstock containing a lanthanide for 1 micron lasing (typically $Nd^{3+}$ or $Yb^{3+}$) as well as a suitable concentration of $CrCl_3$ and $CaCl_2$ (about 0.1 at. %). After growth and polishing, the product crystal is heated in air to 1000° C. for 12-24 hours to oxidize the $Cr^{3+}$ to $Cr^{4+}$. After oxidation the product crystal can be placed in an autoclave with feedstock and under conditions suitable for hydrothermal growth of undoped YAG on the surface. After polishing the product is a single crystal containing a column of co-doped $Cr^{4+};Nd^{3+}$:YAG embedded in undoped YAG. The product can be used as a Q-switched pulsed laser with single mode, polarized emission with high peak power. The power, repetition rate, pulse width and other laser parameters can be controlled by the diode pump power, the laser ion concentration, the $Cr^{4+}$ concentration and the length of the laser gain medium according to methods known to laser designers. The device has the advantage that the length of the cavity can be easily varied by the length of the void in the original seed. Also the aperture can be controlled by the original dimensions of the void.

While certain embodiments of the disclosed subject matter have been described using specific terms, such description is for illustrative purposes only, and it is to be understood that changes and variations may be made without departing from the spirit or scope of the subject matter.

What is claimed is:

1. A method for forming a monolithic heterogeneous crystal comprising:
   forming a void within a crystal, the crystal comprising a first composition that includes a host material, the void extending from a surface of the crystal to an interior location within the crystal, the void defining a depth from the surface to the interior location and defining a cross-sectional area within the crystal;
   depositing a second composition within the void, the second composition comprising the host material, the first and second compositions differing from one another by the presence and/or quantity of one or more dopants.

2. The method of claim 1, wherein the second composition is deposited according to a hydrothermal growth method.

3. The method of claim 1, wherein the void extends from multiple surfaces of the crystal.

4. The method of claim 1, wherein the second composition completely fills the void.

5. The method of claim 1, further comprising forming one or more additional voids in the crystal and depositing compositions within the one or more additional voids, the compositions deposited within the one or more voids being the same or different from one another.

6. The method of claim 5, wherein at least one of the one or more additional voids is surrounded by the deposited second composition.

7. The method of claim 5, wherein the composition(s) deposited in the one or more additional voids is identical to the first composition or the second composition.

8. The method of claim 1, further comprising cutting the crystal along a plane.

* * * * *

UNITED STATES PATENT AND TRADEMARK OFFICE
CERTIFICATE OF CORRECTION

PATENT NO.        : 10,156,025 B2
APPLICATION NO.   : 15/146080
DATED             : December 18, 2018
INVENTOR(S)       : Joseph W. Kolis and Colin D. McMillen Page 1 of 1

It is certified that error appears in the above-identified patent and that said Letters Patent is hereby corrected as shown below:

On the Title Page

Item (73) Assignee: "University of South Carolina, Columbia, SC (US)"
Should read: "Clemson University, Clemson, SC (US)"

Signed and Sealed this
Twenty-eighth Day of January, 2020

Andrei Iancu
*Director of the United States Patent and Trademark Office*